United States Patent [19]

Wang

[11] Patent Number: 5,293,025

[45] Date of Patent: Mar. 8, 1994

[54] METHOD FOR FORMING VIAS IN MULTILAYER CIRCUITS

[75] Inventor: Carl B. Wang, Chapel Hill, N.C.

[73] Assignee: E. I. Du Pont de Nemours and Company, Wilmington, Del.

[21] Appl. No.: 739,295

[22] Filed: Aug. 1, 1991

[51] Int. Cl.⁵ .............................................. B23K 26/08
[52] U.S. Cl. ........................... 219/121.71; 364/474.08
[58] Field of Search ........... 219/121.7, 121.71, 121.72, 219/121.73, 121.74, 121.75, 121.68; 437/173; 427/53.1, 554, 557, 559; 156/643, 644, DIG. 80, DIG. 89; 264/58, 67; 364/474.08, 474.01, 468

[56] References Cited

U.S. PATENT DOCUMENTS

| | | | |
|---|---|---|---|
| 3,742,182 | 6/1973 | Saunders | 219/121.71 |
| 3,770,529 | 11/1973 | Anderson | 219/121.71 |
| 4,152,575 | 5/1979 | Banas | 291/121.73 |
| 4,258,468 | 3/1981 | Balde | 29/830 |
| 4,478,677 | 10/1984 | Chen et al. | 156/643 |
| 4,799,984 | 1/1989 | Rellick | 156/89 |
| 4,806,188 | 2/1989 | Rellick | 156/89 |
| 4,857,698 | 8/1989 | Perun | 219/121.71 |
| 4,959,119 | 9/1990 | Lantzer | 156/644 |
| 4,964,212 | 10/1990 | Deroux-Dauphin et al. | 219/121.68 |
| 5,006,182 | 4/1991 | Gantzhorn, Jr. et al. | 156/89 |
| 5,037,183 | 8/1991 | Gagosz et al. | 219/121.7 |
| 5,063,280 | 11/1991 | Inagawa et al. | 219/121.7 |
| 5,087,396 | 2/1992 | Zablothy et al. | 219/121.71 |
| 5,093,548 | 3/1992 | Schmidt-Hebbel | 219/121.71 |
| 5,155,679 | 10/1992 | Jain et al. | 364/468 |
| 5,168,454 | 12/1992 | La Plante et al. | 219/121.7 |
| 5,233,157 | 8/1993 | Schreiber et al. | 219/121.68 |

FOREIGN PATENT DOCUMENTS

| | | |
|---|---|---|
| 363256 | 4/1990 | European Pat. Off. ........ 219/121.71 |
| 2548258 | 5/1977 | Fed. Rep. of Germany . |
| WO8802928 | 4/1988 | PCT Int'l Appl. . |
| WO8901842 | 3/1989 | PCT Int'l Appl. . |
| WO9107073 | 5/1991 | PCT Int'l Appl. . |

OTHER PUBLICATIONS

Patent Abstracts of Japan, unexamined applications, M Field, vol. 9, No. 226, Sep. 12, 1985, The Patent Office Japanese Government, p. 27 M 412.

Patent Abstracts of Japan, unexamined applications, E field, vol. 15, No. 191, May 16, 1991, The Patent Office Japanese Government, p. 116 E 1068.

Cocca et al., Laser Drilling of Vias in Dielectric for High Density Multilayer Thick Film Circuits, *Solid State Technology*, Sep., 1978, pp. 63–66.

Barrett et al., A Method for Scanning Electron Microscope Analysis of Laser Drilled Thick Film Vias, *Hybrid Circuits*, No. 4, Spring, 1984, pp. 61–63.

Ser. No. PCT/US90/06160, filed Oct. 25, 1990, Kawasaki et al.

*Primary Examiner*—Geoffrey S. Evans

[57] ABSTRACT

The invention is directed to a method for rapidly forming a pattern of vias in multilayer electronic circuits in which each of the via holes is formed by drilling with a controlled number of Nd:YAG laser beam pulses. Beam positioning is controlled by means of a programmed galvanometric beam positioner. The drilling sequence is optionally controlled by application of an heuristic algorithm of the symmetric Traveling Salesman Problem.

1 Claim, 4 Drawing Sheets

METHOD FOR FORMING VIAS IN MULTILAYER CIRCUITS

FIELD OF INVENTION

The invention is directed generally to a method for rapidly forming via holes in inorganic dielectric layers. More particularly, the invention is directed to a method for rapidly forming vias in multilayer electronic circuits.

BACKGROUND OF THE INVENTION

Vias are electrically conductive paths which are used to connect operably adjoining layers of multilayer circuits. The conventional method for producing vias in multilayer circuits is to screen print a pattern of dielectric paste over an underlying conductive pattern by which via holes are formed by the opaque areas of the screen. The printed dielectric layer is then fired and the via holes are filled by screen printing with a conductive thick film paste. Another method for making vias is to punch holes in a dielectric green (unfired) tape, fill the via holes by screen printing in the above-described manner, and fire the tape to remove the organic medium. These methods for making vias for multilayer circuits are, however, limited in that evenly shaped, symmetrical vias can be made reliably only if they are 8-10 mils in diameter or larger for thick film and 4 mils in diameter or larger for green tape. When it is attempted to make smaller vias by these methods, the via holes tend to fill in during printing and firing.

In an attempt to improve upon the conventional screen printing method, various experimenters have suggested the use of laser drilling to form the vias. For example, Cocca et al have suggested the laser drilling of unfired thick film dielectrics overlying thick film conductors (Cocca et al, Laser Drilling of Vias in Dielectric for High Density Multilayer Thick Film Circuits, *Solid State Technology*, September 1978, p 63-66). In drilling via holes by this method, Cocca et al used a pulsed YAG laser at a power level of 42-47 mj using a single laser pulse, which resulted in the removal of the gold conductor pattern underlying the laser-drilled via hole. In addition, Barrett et al disclosed the laser drilling of fired dielectric layers using a pulsed YAG laser set at 1 W having a Q-rate of 1 kHz. The study showed that the depth of the drilled holes was related directly to the number of pulses at a given power level (Barret et al, A Method for Scanning Electron Microscope Analysis of Laser Drilled Thick Film Vias, *Hybrid Circuits*, No. 4, Spring 1984, p 61-63).

More recently, Kawasaki et al, in copending patent application S.N. PCT/US 90/06160, filed Oct. 25, 1990, disclosed the use of a laser beam to form via holes in an inorganic insulating (dielectric) layer having a transparent protective layer on a beam-reflective substrate, filling the via holes with thick film paste, removing the protective layer, and then repeating the sequence to obtain the desired number of layers, after which the entire assemblage is cofired.

None of the prior investigators has, however, devised a method for drilling small via holes with lasers which is capable of meeting the speed and quality requirements of contemporary electronic fabrication methods. That is, in the prior art laser drilling methods, the drilling phase of the manufacturing process is too slow to meet the demands of commercial assembly procedures.

SUMMARY OF THE INVENTION

The invention is therefore directed in a primary aspect to a method for rapidly forming a patterned array of holes of predetermined size in an unfired layer comprising finely divided particles of dielectric solids dispersed in an ablatable organic medium containing substantially no volatile organic solvents, the layer having a thickness of 1-100 microns, comprising the sequential steps of:
   (a) positioning a source of YAG laser light to enable directing the laser beam to a predetermined position on the surface of the dielectric layer;
   (b) directing onto the predetermined position on the surface of the dielectric layer a plurality of YAG laser beam pulses at a rate of at least 1 kHz, the laser beam being characterized as having (1) a beam size of at least 1 mil but no greater than the predetermined size of the hole to be formed, (2) depth of focus greater than the thickness of the dielectric layer, and (3) a power level of at least 1 W, and the number of pulses being sufficient to effect complete ablation of the organic medium through the dielectric layer within area beneath the laser beam without incurring densification of the dielectric solids, thereby forming a residue of finely divided dielectric particles within the thusly formed holes;
   (c) by means of a programmed galvonometric beam positioner, repositioning the laser light source to enable directing the laser beam to a further predetermined position on the surface of the dielectric layer; and
   (d) repeating the sequence of steps (b) and (c) at the rate of at least 50 times per second to form the patterned array of holes in the unfired layer.

In a second aspect, the invention is directed to a method for forming a multilayer circuit having interconnected conductive vias of predetermined size comprising the steps of:
   (a) providing an unfired dielectric layer and forming therein a patterned array of via holes by the method of claim 1;
   (b) removing the residue of dielectric particles from the via holes;
   (c) filling the residue-free via holes with a conductive thick film paste comprising finely divided particles of conductive metal and inorganic binder dispersed in a liquid organic medium;
   (d) applying a pattern of thick film conductor paste comprising finely divided particles of conductive metal and inorganic binder dispersed in a liquid organic medium in appropriate registry with the filled via holes;
   (e) firing the dielectric layer to effect volatilization of the organic media from the dielectric layer and the thick film pastes, densification of the dielectric solids and sintering of the inorganic binder in the thick film pastes; and
   (f) repeating steps (a) through (e) for a sufficient number of times to form the desired number of circuit layers utilizing the exposed surface of the fired assemblage from step (e) of the immediately prior sequence of steps as a substrate.

BRIEF DESCRIPTION OF THE DRAWINGS

The Drawing consists of four figures of which

DETAILED DESCRIPTION OF THE INVENTION

A. In General

The method of the invention is directed to the task of forming via holes and vias in multilayer electronic circuits both quickly and accurately. In particular, the invention is directed to the task of forming extensive patterns of fine (4-6 mils) or smaller vias in green tape and thick film dielectric materials both accurately and rapidly before the layers are fired.

Vias in multilayer electronic circuitry are used to connect electrically the circuit patterns of one layer to another layer where the conductive layers are separated by a relatively thin layer of dielectric material. Because of the substantial circuit density necessary to minimize the areal requirements of complex multilayer circuits, it is essential that the vias be made accurately both as to placement and as to configuration and that they be made very rapidly. For example, a single dielectric layer of a 4×4 inch multilayer circuit may require on the order of 3,000 to 4,000 vias and the device made therefrom may contain as many as 5-10 such layers. Moreover, such devices are frequently required to be produced in large quantities, e.g. several thousand per day.

Though the prior art is replete with teachings of the use of lasers to mark and to drill holes through various organic and inorganic materials, a substantial problem has been how to produce such holes sequentially fast enough to make laser drilling practical. The invention approaches the problem through the use of an optimized laser system in which both beam placement and the via hole drilling functions are computer controlled in accordance with the physical properties and configuration of the dielectric layers.

B. Laser Optical System

The preferred laser optical system for use in the practice of the invention is comprised of four major components. The first is a Q-switched Nd:YAG laser which is the source of energy for drilling the via holes. The second component is a helium-neon (He-Ne) laser which produces a low energy visible red beam of light. The beam from the He-Ne laser is colinear with the invisible beam from the YAG laser and functions as a marker for observation of the effects of the YAG laser. The third component is a beam positioner and the fourth component is a TV camera which is used to observe the results of the drilling operation. The TV camera is not, of course, essential to the operation of the method. However, it is highly preferred to facilitate evaluation and control of the drilling operation. Under computer control, the beam positioner conditions and positions the focused He-Ne and YAG beams over the drilling area. A dichroic mirror entirely reflects the invisible infra-red light from YAG laser onto the work surface, and partially reflects the visible He-Ne light onto the work surface. Reflection of the visible light upward through the dichroic lens permits viewing of the work surface by the TV camera. A microscope can, of course, be used for the viewing function in place of the TV camera.

Figure 1:
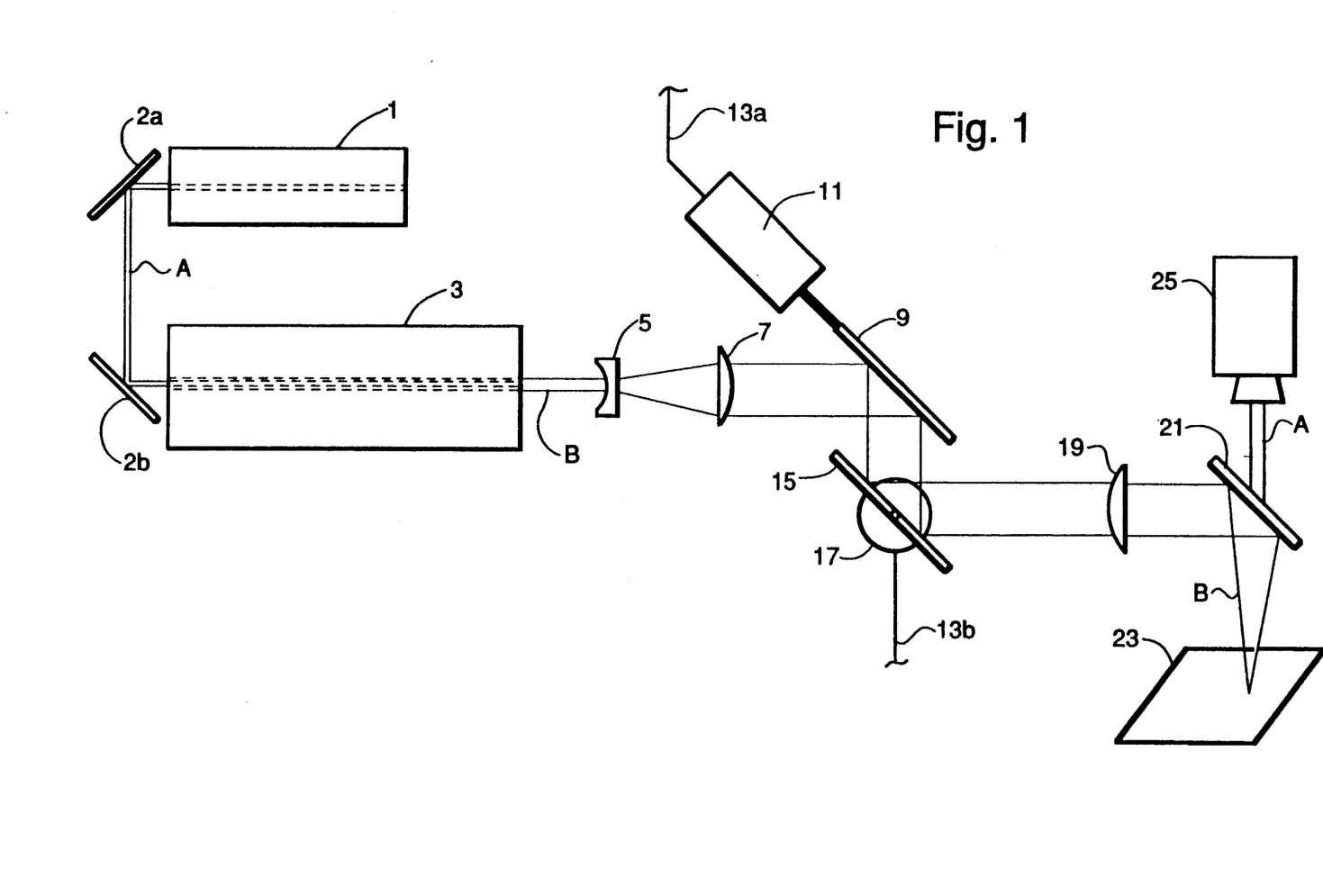
FIG. 1 is a schematic representation of the Laser Optical System that is used for carrying out the method of the invention and FIGS. 2-4 are schematic flow diagrams illustrating the sequence of manipulative steps used for the manufacture of electronic multilayer circuits as set out in claims 8, 14 and 15 respectively.
Figure 2:
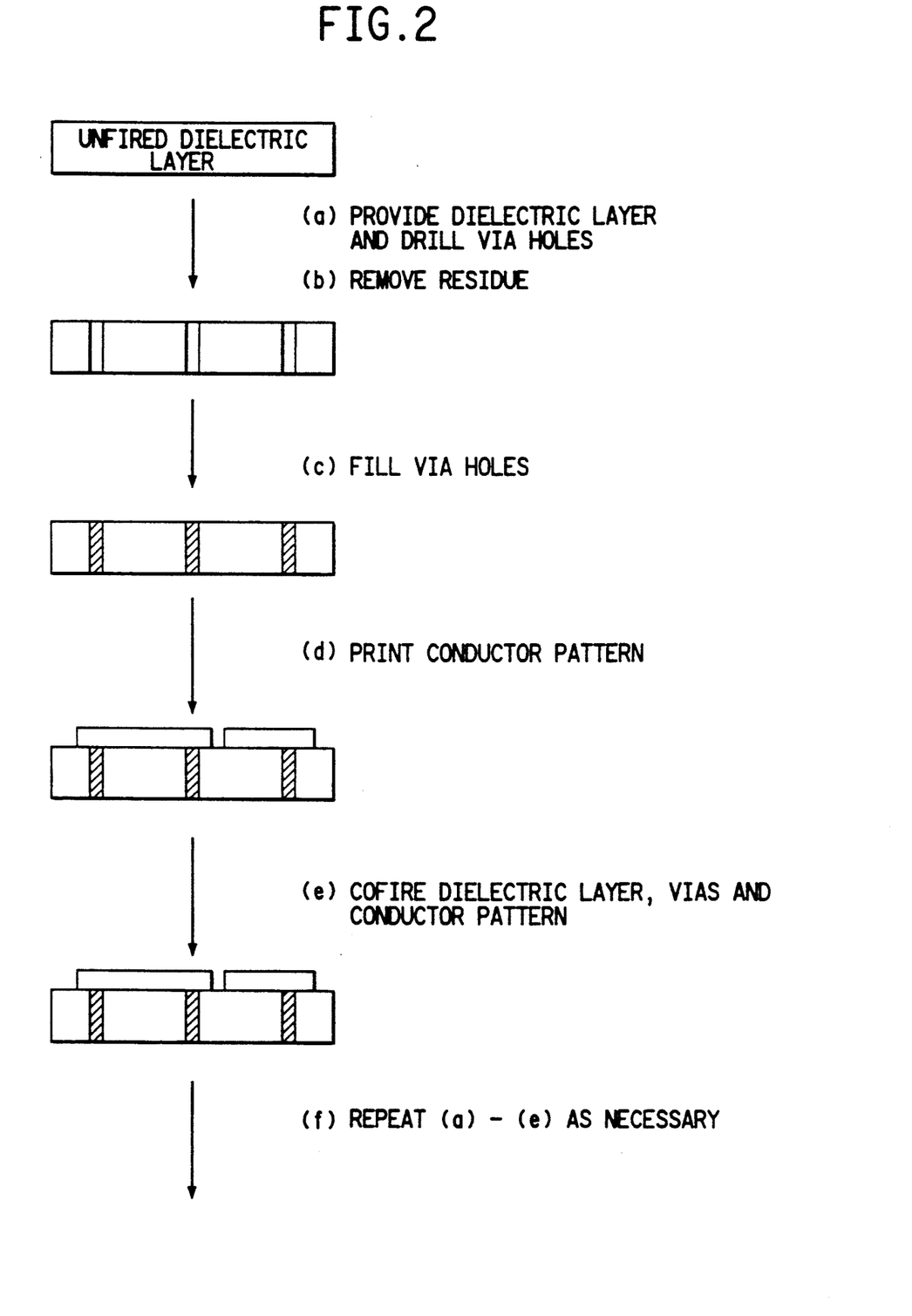
Figure 3:
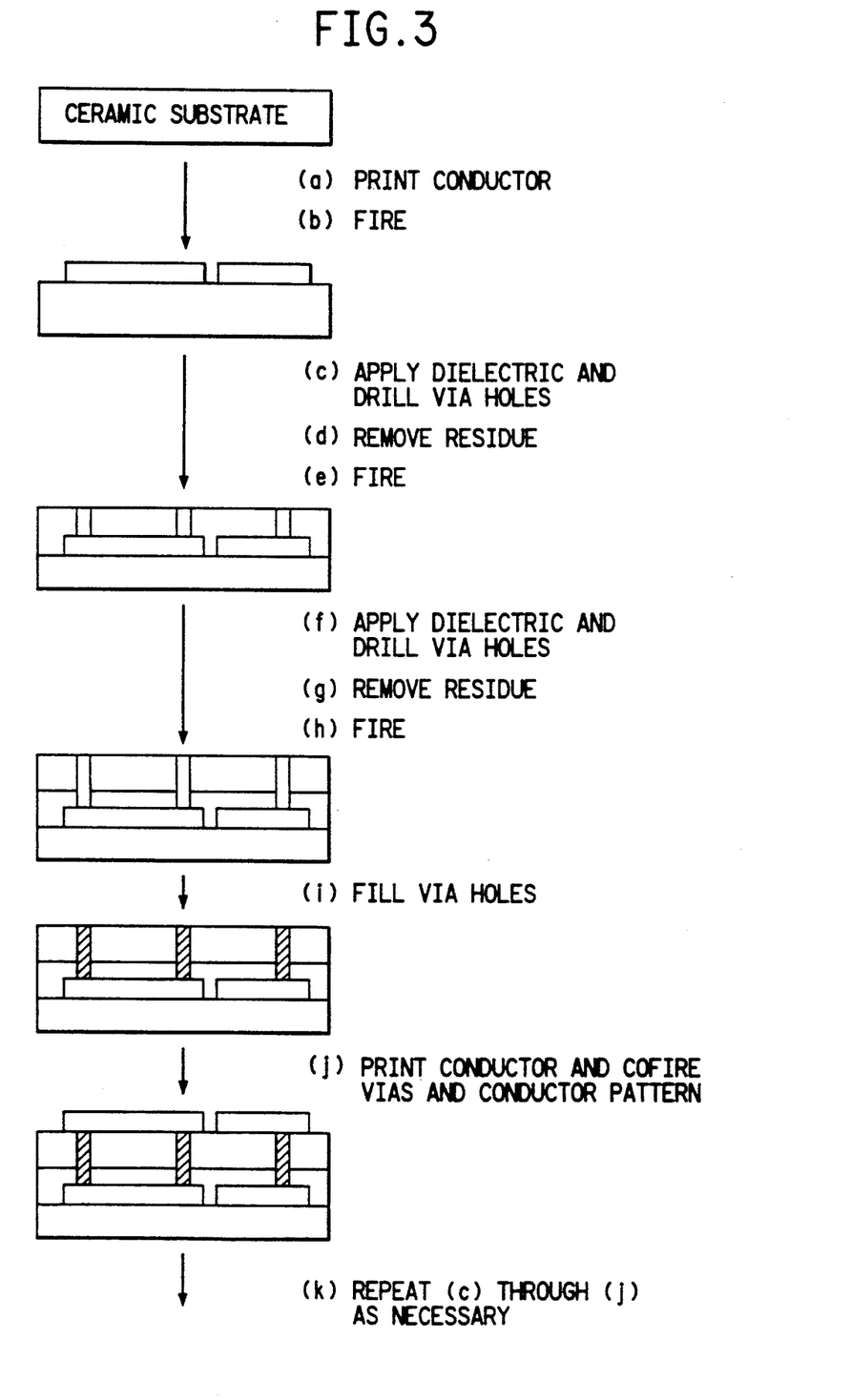
Figure 4:
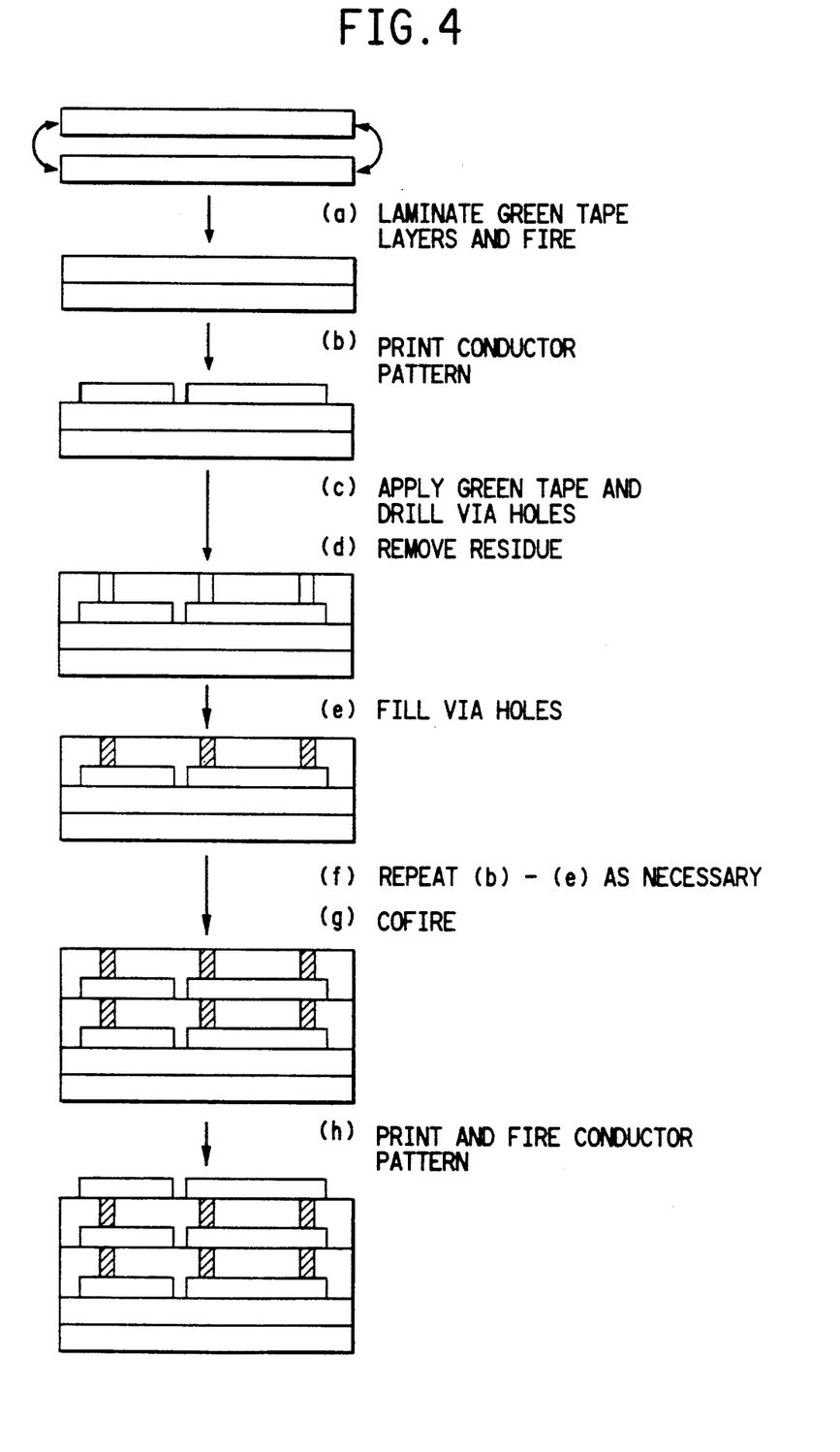

Turning now to FIG. 1 of the drawing, a He-Ne laser 1 is used to generate a visible beam of collimated light A which is reflected by mirrors 2a and 2b into Nd:YAG laser 3. In laser 3, an invisible infrared laser beam is generated colinearly with the visible He-Ne beam and the combined beams B are passed through beam expander 4 which is comprised of eyepiece 5 and objective lens 7. From the beam expander 4, the light is directed to a first mirror 9, the X-mirror, which is rotatable by a first galvanometer 11 in response to computer signals received via X-axis drive interconnection 3a and serves to position the beam B with respect to its X-axis location on the work piece 23. From X-mirror 9, the expanded and combined laser beams B are reflected to a second mirror 11, the Y-mirror, which is rotatable by a second galvanometer 14 in response to computer signals received via Y-axis drive interconnection 13b, which serves to position the beam B with respect to its Y-axis location on work piece 23. From Y-mirror 14, the expanded and combined laser beams B are passed through focusing lens 19 to impinge upon dichroic lens 21. The invisible YAG beam is reflected downward to work piece 23 in accordance with the position determined by the X and Y mirrors and the visible He-Ne light is partially reflected downward to the work piece 23 and then upward through the dichroic lens 21 into TV camera 25 for viewing.

C. Materials

One of the many advantages of the method of the invention is that it can be carried out using conventional thick film conductive and dielectric materials and dielectric green tapes as well as the conventional techniques for applying these materials to the formation of electrical circuitry.

Thus the conductive layers or metallizations can be formed from conventional thick film conductive pastes comprised of finely divided particles of conductive metal or metal oxide dispersed in an organic medium having appropriate rheology for screen printing application. Such printable thick film pastes may also contain finely divided particles of inorganic binder. After being printed in an appropriate circuit pattern, the conductive thick film layer is fired to effect volatilization of the organic medium and sintering of the solid components.

The dielectric layers are preferably formed by laminating one or more layers of dielectric green tape. Dielectric green tapes are comprised of finely divided dielectric materials such as barium titanate, alumina or glass dispersed in a polymeric matrix which is pyrolyzable when the laminated tape is fired in either an oxidizing or nonoxidizing atmosphere. Upon firing, the polymeric matrix is pyrolyzed (burned out) and the dielectric material is sintered and/or densified. The dielectric layers can also be formed by applying a layer of thick film dielectric paste.

Such thick film conductor compositions and dielectric green tapes and the methods of applying them are well known in the electronic materials art.

A sine qua non of all substrate materials to be used in the invention is that they must be rigid when formed into thin layers (e.g., 600 microns) and they must be dimensionally stable. That is, they should not undergo any substantial degree of bowing when they are fired and, most importantly, they should possess stability in the X-Y plane. Most frequently, the substrates used for the invention will be made from electrically insulative ceramic materials such as alumina. However, in some instances, substrates can be used which are made from laminated green tapes, heat-conductive metals or from ceramic-coated metals such as porcelainized steel.

Via holes in the green tape layers can be filled by either of two methods. In one technique, the via holes are filled by screen printing a thick film conductive paste directly into the via holes. In another method, the via holes are filled during screen printing of an overlying conductive layer by flow of the thick film paste into the via holes.

The method of the invention can be used to prepare multilayer circuits containing, for example, 15–20 conductive layers. Green tapes will usually have thicknesses of from about 50 to 400 microns.

The method of the invention can be, however, used to drill holes through dielectric materials as thick as 2000 mils provided that the laser power level and depth of focus are ample.

D. Laser Operation

In the practice of the method of the invention, it is essential that the beam of the Nd:YAG laser be precisely controlled in order to make via holes of proper size and shape without damaging either dielectric or conductive layers which may underly the via hole. To do this successfully, it is necessary to control the following four variables: (1) beam size; (2) focus depth; (3) beam power level; and (4) rate and number of pulses. In addition, it is vital that the beam pulses be coordinated with the beam positioner.

Beam Size: The beam size (diameter) is, of course, directly related to the diameter of the hole being drilled. Therefore, the beam size will never exceed and usually will be somewhat smaller than the desired diameter of the via hole. The beam size is determined by the mode selecting aperture (Front and Rear) diameter which determines the mode in which the laser will oscillate. The lowest order mode has the smallest diameter beam. (It is often used for trimming fired thick film resistors.) Higher order modes can be used which give via holes which are larger in diameter. However, higher order modes may have areas of zero power density within their cross-section. Because of the larger area and greater power, they are capable of removing more material per pulse. However, the areas of zero power density may have incompletely evaporated materials left within the kerf. It is therefore preferred to use the smallest appropriate beam size.

Focus Depth: In order to drill completely through a given dielectric layer, it is essential that the focus depth of the beam extend beyond the thickness of the layer. In most instances, it is preferred that the extent of the focus beyond the layer thickness be as small as possible consistent with obtaining complete penetration of the layer by the laser beam. This is easily determined by examination of the via hole and the underlying conductive or dielectric layer at any given set of beam parameters.

Power Level: Because of the energy needed to ablate the organic material removed during formation of via holes, it is essential that the power level of the laser beam be sufficient to perform the operation within a relatively short time and/or with a comparatively low number of pulses. Therefore, for the purposes of the invention, it has been found that the laser power level should be at least 1 W. It is preferred that the average laser beam power level be 3–5 W for thick film dielectrics and 6–8 W for green tape dielectrics. Higher average power levels may be used for thicker dielectric layers.

Rate and Number of Pulses: It will be recognized by those skilled in laser operation that, in theory at least, the invention could be carried out using a continuous laser beam. However, as a practical matter, such type of operation would consume unnecessarily large amounts of power and, moreover, with current laser technology, such a laser of several Kilowatts continuous output would be too costly to build, operate and maintain.

The number of pulses needed to effect formation of a via hole without damage to the underlying substrate is related to the thickness of the layer, the chemical composition of the layer, the diameter of the via hole and the pulsed power level.

In carrying out the invention, it is preferred that the power level be adjusted in such manner that at least two beam pulses and preferably five or more pulses are used to form the via hole. The use of a plurality of pulses gives more control over the operation of the method since the number of pulses can be more readily regulated than the power level. Typically, the invention is carried out at a power level such that 6 or 7 pulses are sufficient to effect via hole formation.

In order to carry out the invention at a practical rate, it is, of course, necessary that the pulse rate be extremely rapid. In particular, the method of the invention is directed to drilling rates on the order of at least 50 and preferably 100 via holes per second. To accomplish this feat, it is necessary at the current state of laser development to use a Q-switched laser at a rate of at least 1 kHz and preferably at a rate of 10 kHz or even higher. The Q-switch creates high peak power outputs from the laser by causing the laser periodically to store energy and then release it in narrow pulses (e.g., 100 to 300 nanoseconds wide). It will be recognized that laser switching means other than the Q-switch may be developed in the future. However, with the present state of the art the only practicable means of attaining such rapid pulsed laser operation is by means of the Q-switch.

Coordination With Beam Positioner: Especially in view of the fact that via holes are being drilled in accordance with the invention at a rate of at least 50 per second, it is clear that the pulsing action of the laser beam must be carefully coordinated with the positioning of the laser beam on the work piece. Thus, the beam positioner and laser are controlled so that the laser does not pulse until a very short time has elapsed after the repositioning of the beam. The delay between the time the beam is repositioned and the time the beam pulse is triggered is controlled by what is referred to as the "galvo flag" in the examples which follow. The galvo flag is a tunable parameter of the beam positioner which provides sufficient time for the X and Y galvo mirrors to be settled to the required angular positions and sufficiently damped that the laser beam is within +/−1 mil of the target position on the work piece before the pulse or series of pulses is emitted. In addition to the galvo flag, a computer command may be used to add extra waiting time after the laser beam positioning requirement has been met. This is known as galvo wait.

To increase the drilling speed further, one may employ (a) lighter galvo mirrors which will shorten the settling time (i.e., time to meet the galvo flag requirement), (b) multiple laser, optics and galvo devices driven by one computer operating system in a laser equipment, or (c) a single laser splitted/guided by multiple optics/galvo, which are driven in one computer operating system in a laser equipment. The above system can be implemented by use of modern optics and mechanical design so long as the benefit of increasing the throughput justifies the required development time and cost.

E. Drilling Sequence

Because of the extremely high number of via holes which are required in many multilayer devices, it is preferred to carry out the via hole drilling sequence in such manner that the laser beam travels the least distance during the drilling operation. This is preferably accomplished by application of an algorithm of the symmetric Traveling Salesman Problem (TSP), which is directed to determination of the shortest distance to complete a tour among a large number of cities. In circumstances where the number of "cities" is very large, there is no exact solution. However, heuristic solutions of the problem, which approach within 2% of the perfect solution, are available. These can be used effectively to reduce substantially the elapsed time for carrying out the method of the invention by as much as 50%. Many such algorithms are derivatives of the method derived by Lin and Kernighan of Bell Laboratories in Murray Hill, N.J. In this application to the method of the invention, software for the method is programmed into the beam position computer and the sequence is carried out by signals to the X and Y mirror galvonometers.

F. Laser Drilling Applications

The above described laser drilling method can be used in the fabrication of multilayer electronic circuits using conventional thick film and/or green tape materials. It can also be used to drill holes in either single layers of either thick film or green tape dielectric layers or in multiple layers containing either or both types of materials.

Following are described a number of these applications as they pertain to the formation of multilayer circuits having fine (4–6 mil or smaller) vias. Three major dielectric systems are described:

(1) Thick film multilayers on ceramic substrates;
(2) Green tape multilayers; and
(3) Green tape multilayers on ceramic substrates either with or without thick film multilayer circuits.

(1) Thick Film Multilayers on Ceramic Substrates The process is summarized in Table 1

TABLE 1

| Multilayer Circuits Fabricated with Thick Film Dielectrics | | |
|---|---|---|
| No. of Steps | Materials/Methods | Processs |
| 1 | Substrate | Cleaning if needed |
| 2 | Conductor | Print/Dry/Fire |
| 3 | Dielectric | Print/Dry |
| 4 | Forming Via Holes | Laser Drill/Fire |
| 5 | Repeating Steps 3 & 4 | |
| 6 | Filling Vias | Print/Dry |
| 7 | Conductor | Print/Dry/Cofire |
| 8 | Repeating Steps 3 to 7 to build multilayers | |

Depending on the electrical property requirements, one can also repeat step 3 multiple times, before proceeding to steps 4 and 6 (skip 5). Conventional screen printing was used in steps 2, 3, 6, and 7, but other methods for producing fine conductor circuit traces may also be used. In step 3, a pinhole free dielectric layer may be achieved by blanket printing, while all of the via holes can be laser drilled later (step 4). In the case of forming via holes of different sizes in the same dielectric layer, one may also use existing dielectric material to print larger (i.e. 10 mils and larger) via holes, and to use the laser to produce the remaining smaller holes.

Table 2 summarizes the laser drilling parameters for the method shown in Table 1:

TABLE 2

| Laser Drilling Parameters | |
|---|---|
| Variables | Range |
| Q-Switched Rate | 8–20 KHz |
| Power | 0 to 15 watts |
| Current | 0 to 30 amps |
| Galvo Flag | +/− 0.5 to 2 mils |
| Additional Galvo Wait | 0 to 20 ms |
| Over Blast (ca. No. of Pulses) | 1 to 100 |
| Beam Expansion (Focussing Condition) | +/− 20 mils from focal plane |
| Front Aperture | 1.0 to 2.0 mm |
| Rear Aperture | 1.0 to 2.0 mm |
| Compressed Air Purge | 5 to 20 psi |
| Residue Removal | 10–30" Hg. vacuum |

Note:
Galvo flag is a tunable parameter to trigger the laser beam. For example, a +/− 1 mil galvo flag means that the residual damping of X and Y galvo mirrors must be settled to certain angular range so that the laser beam is within +/− 1 mil of the target position on the work plate before it is emitted.
Galvo wait is a computer software command to add extra waiting time after the laser beam positioning requirement (galvo flag) has been met.

In the laser via drilling process, multiple pulses of higher order mode YAG were used to produce 4 mil vias without any descernable incompletely evaporated (or decomposed) material inside the via holes. The ultimate via size depends on (1) taper of via wall, (2) acceptable via drilling speed, and (3) ability to fill vias. Assuming a 1 to 1.5 mil taper, the smallest via size will be 2 to 2.5 mils, which can't be produced by prior art methods at a speed exceeding 50–100 via holes per second. Table 3 describes via hole size as a function of aperture size:

TABLE 3

| Correlation of Via Hole Size With Laser System Parameters | | |
|---|---|---|
| Front Aperture mm Diameter | Rear Aperture mm Diameter | Via Hole Size mil Diameter |
| 2.0 | 2.0 | 7 to 8 |
| 1.6 | 2.0 | 5 to 6 |
| 1.3 | 2.0 | 4 to 5 |
| 1.3 | 1.2 | 2 to 3 |

Note:
The above via hole diameter was measured from the top surface of the dielectric layer after firing.

The beam enters from the laser through the beam expander and impinges on the X axis mirror and then the Y axis mirror. These mirrors are moved by the galvanometers to position the beam in the X and Y directions. A fundamental optical principle states that for a given order mode, the spot size to which a beam will converge is inversely proportional to the cone angle of the converging beam. Therefore, optimized aperture size and beam expansion factor can produce 2-3 mil via holes.

During the laser drilling, the intense laser beam provides localized heating, which decomposes and ablates or vaporizes the organic medium in thick film or green tape dielectrics without damaging the underlying conductor traces. To control the process, the following are key requirements: (1) to produce dielectrics of uniform thickness; (2) consistently to control the laser energy to form via holes, but not to melt, vaporize, degrade or oxidize the underlying conductor; and (3) to drill via holes at a speed compatible with circuit production, while maintaining via hole placement accuracy.

The via hole placement accuracy depends on (1) built-in software calibration routines, (2) built-in tunable hardware (galvo flag), (3) distance between any two via holes in the routing sequence, (4) laser positioning precision, and (5) repeatability of substrate placement. Items 1, 2, and 4 depend largely on the laser system. Application of the TSP optimizes distance between holes and substrate placement is a function of sample stage design.

A given via hole X and Y coordinate file is reformatted with its routing sequence optimized before being loaded to the computer to command drilling. Written by Donald L. Miller (DuPont Central Research and Development Department) and Joseph F. Pekny (Purdue University), the optimization program applies 2-Matching algorithm (based on Lin-Kernighan algorithm) to solve the "Traveling Salesman Problem". This problem is a mathematical one that deals with finding the best sequence from among a very large number of possible sequences. By implementing the above program, smaller total traveling distance and, for a large fraction of sequential via holes, a smaller distance between them are obtained consistently. This results in faster drilling speed and/or tighter placement accuracy.

(2) Green Tape (GT) Multilayers

The process is summarized in Table 4:

TABLE 4

Multilayer Circuits Fabricated With Green Tape Dielectrics

| No. of Steps | Materials/Methods | Process | No. of Tape Layers |
|---|---|---|---|
| 1 to x | Green Tape | Blank | x |
| x + 1 | Conductor | Print/Dry | x + 1 |
| x + 2 | Green Tape | Blank | x + 2 |
| x + 3 | Forming Via Holes | Laser Drill | x + 2 |
| x + 4 | Filling Via Holes | Print/Dry | x + 2 |
| x + 5 | Conductor | Print/Dry | x + 2 |
| x + 6 | Repeat Steps x + 2 to x + 5 to Build Multilayers | | |
| x + 7 | Forming Via Holes | Blank/Laser Drill | |
| x + 8 | Filling Via Holes | Print/Dry | |
| x + 9 | | Collate/Laminate/Fire | |
| x + 10 | Top Layer Conductor | Print/Dry/Fire | |
| x + 11 | Singulation | Dicing Saw | |

The first x layers of tape were used whenever needed to form a dimensionally stable substrate. Conventional screen printing or any methods producing fine conductor traces may be applied in any step involving printing. In case of forming via holes of various sizes in the same green tape sheet, one may use laser alone, or in combination with other drilling means (such as die blanking, punching). The laser drilling parameters shown in Table 2 may also be applied to the green tape. At the present time, green tape is several times thicker than the thick film dielectric, and therefore it is necessary to apply more laser power and/or pulses (over blasts) to enable via hole drilling. Consequently, a higher drilling throughput can be achieved when thinner green tape materials are available, because the laser can drill multiple layers of thinner green tape sheets simultaneously.

The laser can be used to drill through holes in green tape sheet(s), with or without backing (normally made of polymer, e.g., Mylar® polyester film). When through via holes are to be made in a green tape sheet without backing, it is harder to remove all of the debris generated by the laser. For this purpose, a sample stage with vacuum holes at the periphery of green tape sheet, which is at least $\frac{1}{2}$ inch away from the border of via hole pattern is used. A lint-free paper is inserted between the green tape sheet and stage. A deionized compressed air jet and a vacuum pick-up are applied, at a 45° angle to the green tape sheet, from its opposite edges. Depending on the dimension of the sheet, a grid made of metal (or other material) may be laid on the top of the sheet, permitting the laser to pass the perforated openings on the grid, and preventing any flip-flop of the flexible sheet, by the air jet or vacuum. Other stage design and tape or stage cleaning steps may also be used so long as they eliminate the debris on both sides of the green tape sheet.

(3) Green Tape Multilayers on Ceramic Substrates

It may be desirable at times to combine the benefits of thick film multilayer on ceramic substrates (e.g., mechanical strength, thermal conductivity, dimensional stability) with those of green tape multilayer construction (design flexibility, device miniaturization, lower processing cost). A process to produce such circuits is described in the following:

(a) Ceramic Substrates with Thick Film Multilayer Circuits

These multilayers are made either by laminating a pre-circuited ceramic substrate (made by the methods described in Section 1. above) with (1) a green tape multilayer (made by the processes described in Section 2 hereinabove), (2) a single green tape sheet, laser drilling and repeating the process multiple times or (3) a single green tape sheet, laser drilling and/or via filling, firing and repeating the process multiple times. The laser produces through or blind via holes respectively, as applied to laminates made by option 1 or options 2 and 3.

Table 5 summarizes the processes and laser parameters:

TABLE 5

| | No. of Steps | Materials/Methods | Process |
|---|---|---|---|
| Option 1 | | | |
| I | 1 to 8 (Table 1) | Prepare thick film multilayer on ceramic substrate. | |
| II | x + 1 to x + 6 (Table 4) | Prepare GT sheets with specified circuit and via connections | |
| III | 1 | Attach GT to thick film circuits | Collate/Laminate/Fire |
| | 2 | Top layer conductor | Print/Dry/Fire |
| | 3 | Singulation | Dicing Saw |
| Option 2 | | | |
| I | 1 to 8 (Table 1) | Prepare thick film multilayer on ceramic substrate | |
| II | x + 2 to x + 5 (Table 4) | Prepare GT sheets with specified circuit and via connections | |
| III | 1 | | Laminate |
| | 2 | Repeat steps II and III.1 | |
| | 3 | | Fire |

TABLE 5-continued

| | No. of Steps | Materials/Methods | Process |
|---|---|---|---|
| | 4 | Top layer conductor | Print/Dry/Fire |
| | 5 | Singulation | Dicing Saw |
| Option 3 | | | |
| I | 1 to 8 (Table 1) | Prepare thick film multilayer on ceramic substrate | |
| II | 1 | Green Tape | Blank/Laminate |
| | 2 | Forming via holes | Laser drill |
| | 3 | Filling via holes | Print/Dry |
| | 4 | Conductor | Print/Dry/Cofire |
| | 5 | Repeat steps II.1 to II.4 | |
| | 6 | Singulation | Dicing Saw |

(b) Ceramic Substrates without Thick Film Multilayer Circuits

Replace the ceramic substrates described in Step I (Options 1, 2 and 3) with blank ceramic substrates, and follow all other detailed procedures.

EXAMPLES

EXAMPLE 1

A 30 to 60 micron thick unfired glass/ceramic dielectric thick film was printed and dried on ceramic substrate. A Q-switched YAG laser (CLS77W, made by Chicago Laser Systems Inc.) was used to drill blind vias using conditions listed in Table 2. CLS77W covers a 8" by 8" field, and galvo flag was set at +/−2 mils.

4 to 7 mil diameter via holes were formed with a regular pitch (center-to center spacing) size of 40, 60, 80, 120, or 160 mils. Table 6 summarizes the results:

TABLE 6

| Laser Drill Speed vs. Pitch Size | | | | |
|---|---|---|---|---|
| Total No. of Vias | Total Time, s | Pitch Size, mils | No. of Pitches to Hub | Avg. Drill Speed, /s |
| 8,364 | 59 | 40 | 8,330 | 142 |
| | | 60 | 33 | |
| 4,216 | 34 | 40 | 34 | 124 |
| | | 60 | 33 | |
| | | 80 | 4,148 | |
| 2,108 | 19 | 40 | 17 | 111 |
| | | 80 | 2,074 | |
| | | 160 | 16 | |
| 2,788 | 39 | 40 | 34 | 71 |
| | | 60 | 33 | |
| | | 120 | 2,720 | |

Note:
Substrate size was 6" × 4".

The thick film dielectric compositions used in this example were either vitreous/filler system (DuPont 5704) or crystallizable/filler system (DuPont QM41D and QM51D) crystallizable glass/filler dielectric.

It was noted that extra galvo wait was necessary to control the via hole placement accuracy, especially those associated with more than 60 mil pitch sizes. Although an 8" by 8" field coverage made it a one step operation to drill via holes in a 6"×4" part (i.e. without stage movement); the beam positioning system is equipped with large diameter optical lenses, and large motors to rotate either or both X and Y galvo mirrors. However, greater mirror inertia requires longer settling times to reach the pre-set galvo wait limit, and to build a laser system with smaller optics and lighter mirrors seem to be one way to improve the drill speed. Example 2 summarizes the results using a laser system with a 3" by 3" field coverage. This requires a collaborating stage movement, when parts with overall dimensions larger than 3" by 3" are to be laser drilled.

It is also found that a tighter galvo flag control (i.e. +/−0.5 mils instead of +/−2.0 mils) is useful for better via hole placement accuracy. The benefit of delaying the time to trigger laser beam, because of a tighter galvo flag is that the need of any extra galvo wait is eliminated.

EXAMPLE 2

Three thick film dielectric compositions were laser drilled, by use of a CLS960 (made by Chicago Laser Systems Inc.), which has a 3" by 3" field coverage. The laser parameters are the same as those listed in Table 2, except that the galvo flag was set at +/−0.5 mils, and drill via holes without any additional galvo wait.

The only difference in dielectric compositions was the percentage concentration of cobalt oxide, which has been found to be an effective YAG absorber. Table 7 compares the three compositions and lists the laser power needed to drill via holes. It is advantageous to apply the least laser power, as the risk of damaging conductor circuit (in case of thick film multilayers) or presintering the dielectrics (either thick film or green tape) is much lower.

The prototype for this test has 25 repeating via patterns, covering a 4" by 4" area. The smallest pitch size is about 20 mils. An heuristic algorithm of the symmetric Traveling Salesman Problem was used to rearrange the via hole drilling sequence. The overall via pattern was divided into four quadrants, individually optimized, and linked together. Since the true via pattern (4" by 4") exceeds the field coverage (3" by 3"), it was necessary to move stage three times to complete the pattern. With 30 micron thick unfired dielectric thick film composition C, a speed of 175 vias per second has been achieved for each quadrant. This is equal to an overall speed of 170 vias per second for the entire part.

TABLE 7

| Dielectric Compositions vs. Optimum Power Levels | | | |
|---|---|---|---|
| Composition | A | B | C |
| Weight % Cobalt Oxide | 0 | 0.5 | 1.2 |
| Power to Drill Via Holes, mW | 18 | 12 | 9 |

EXAMPLE 3

Two types of green tape dielectrics (A and B) were used, with their material and process specifications summarized in Table 8. The same via pattern as described in Example 2 was applied.

TABLE 8

| Composition | A | B |
|---|---|---|
| Materials | | |
| Dielectric Glass | Vitreous | |
| Crystallizable Filler | Ceramic | Ceramic |
| Thickness Un-fired, mils | 4.5 | 5.0 |
| Processes | | |
| Power to drill via holes, mW | 10 to 20 | 10 to 20 |
| Over Blast | 15 to 25 | 20 to 30 |
| Drilling Speed, /s | | |
| Per Quadrant | 170 | 160 |
| Per Part | 165 | 155 |

EXAMPLE 4

A "colored green tape" has been used with its material and process specifications summarized in Table 9. The same via pattern as described in Example 2 was applied. In order to drill through a total of three tape layers, the number of laser pulses was increased (compared to Table 8). However, the effective throughput, counting the total number of vias formed simultaneously, was also increased by 95%. Cobalt oxide pigment has contributed to reduce the required laser power, and it is very likely that a thickness reduction of "colored green tape" will enable laser to drill more than three layers simultaneously and further increase the effective throughput.

TABLE 10

| Materials | |
|---|---|
| Dielectric | |
| Glass | Vitreous |
| Filler | Ceramic |
| Pigment | Cobalt Oxide |
| Thickness Unfired, mils | 4.5 |
| No. of Tape Layers | 3 |
| Processes | |
| Power to drill via Holes, mW | 25 to 40 |
| Over Blast | 40 to 50 |
| Via Size, mils | 2 to 3 |
| Drilling Speed, /s | |
| per Quadrant | 110 |
| per Part | 108 |
| Throughput (3 parts), /s | 324 |

I claim:

1. A method for rapidly forming a patterned array of via holes of predetermined size in an unfired layer comprising finely divided particles of dielectric solids dispersed in an ablatable organic medium containing substantially no volatile organic solvents, the layer having a thickness of 1-2000 microns, comprising the sequential steps of:

(a) positioning a source of YAG laser light to enable directing the laser beam to a predetermined position on the surface of the dielectric layer;

(b) directing onto the predetermined position on the surface of the dielectric layer a plurality of YAG laser beam pulses at a rate of at least 1 kHz, the laser beam being characterized as having (1) a beam size of at least 1 mil but no greater than the predetermined size of the hole to be formed, (2) depth of focus greater than the thickness of the dielectric layer, and (3) a power level of at least 1 W, and the number of pulses being sufficient to effect complete ablation of the organic medium through the dielectric layer within area beneath the laser beam without incurring densification of the dielectric solids, thereby forming a residue of finely divided dielectric particles within the thusly formed holes;

(c) by means of a programmed galvonometric beam positioner, repositioning the laser light source to enable directing the laser beam to a further predetermined position on the surface of the dielectric layer; and (d) repeating the sequence of steps (b) and (c) at the rate of at least 50 times per second to form the patterned array of holes in the unfired layer;

in which the rate of forming the via holes in the patterned array is optimized by drilling the via holes in a sequence determined by application of an heuristic algorithm of the symmetric traveling salesman problem.

* * * * *